United States Patent [19]

Schonstedt

[11] 4,258,320

[45] Mar. 24, 1981

[54] APPARATUS AND METHOD EMPLOYING FOAM SLEEVES FOR SUPPORTING MAGNETIC SENSORS IN A TUBULAR HOUSING

[75] Inventor: Erick O. Schonstedt, Reston, Va.

[73] Assignee: Schonstedt Instrument Company, Reston, Va.

[21] Appl. No.: 931,937

[22] Filed: Aug. 7, 1978

Related U.S. Application Data

[60] Continuation-in-part of Ser. No. 757,124, Jan. 5, 1977, Pat. No. 4,110,689, which is a continuation of Ser. No. 542,084, Jan. 17, 1975, abandoned, which is a division of Ser. No. 303,598, Nov. 3, 1972, Pat. No. 3,894,283.

[51] Int. Cl.³ .................. G01R 33/00; H02G 3/00
[52] U.S. Cl. .................. 324/262; 174/99 R; 29/235
[58] Field of Search .................. 324/219–221, 324/245, 253, 254, 255, 262; 29/235, 451; 174/28, 99 R, 111; 138/108, 113, 114

[56] References Cited

U.S. PATENT DOCUMENTS

| 2,642,479 | 6/1953 | Jones | 324/255 |
| 2,874,981 | 2/1959 | Brady | 29/451 |
| 2,911,460 | 11/1959 | Oxley | 29/451 |
| 3,026,610 | 3/1962 | Wakefield | 29/451 |
| 3,071,851 | 1/1963 | Haushalter | 29/451 |

Primary Examiner—Gerard R. Strecker
Assistant Examiner—Walter E. Snow
Attorney, Agent, or Firm—Shapiro and Shapiro

[57] ABSTRACT

A magnetic sensor assembly including an elongated support is supported in a tubular housing by a pair of tapered foam sleeves that space the support from the inner surface of the housing and that resist movement of the assembly in the housing in a direction opposite to the direction of insertion of the assembly into the housing. The sleeves, which are either continuous hollow cylinders or are formed of wound strips, are attached to the support by adhesive tape at the leading end of each sleeve.

12 Claims, 5 Drawing Figures

APPARATUS AND METHOD EMPLOYING FOAM SLEEVES FOR SUPPORTING MAGNETIC SENSORS IN A TUBULAR HOUSING

REFERENCE TO CO-PENDING APPLICATIONS

This application is a continuation-in-part of Ser. No. 757,124, filed Jan. 5, 1977, now U.S. Pat. No. 4,110,689, issued Aug. 29, 1978 which is a continuation of Ser. No. 542,084, filed Jan. 17, 1975, now abandoned, which is a division of Ser. No. 303,598, filed Nov. 3, 1972, now U.S. Pat. No. 3,894,283, issued July 8, 1975.

BACKGROUND OF THE INVENTION

This invention relates to magnetic detector apparatus such as magnetic locators of the type described in the aforesaid patent, and is more particularly concerned with improvements in the support of magnetic sensors in tubular housings.

In the magnetic detection apparatus described in Pat. No. 2,642,479 to Jones, a tube which serves as a mounting for magnetic sensors or detectors is supported in a tubular housing by sponge rubber bushings or rings. Such bushings can provide desired centering and shock mounting of the magnetic detectors in the housing. However, if they are small enough to permit the detector assembly to enter the housing axially, they do not perform their intended function well, and if they are large enough to perform their intended function, they tend to impede the insertion of the detector assembly into the housing axially. The present invention is directed to an improved apparatus and an improved method for supporting magnetic sensors in a tubular housing.

BRIEF DESCRIPTION OF THE INVENTION

An object of the invention is to permit insertion of a magnetic sensor assembly into a tubular housing axially, to shock mount and center the assembly in the housing, and to resist movement of the assembly in the housing in a direction opposite to the direction of insertion.

In accordance with one of the broader aspects of the invention, apparatus for supporting magnetic sensors in a tubular housing comprises an elongated support adapted to have magnetic sensors mounted thereon, and a resiliently compressible sleeve through which the support extends, the sleeve being attached to the support and being tapered so that it is narrower at a leading end portion than at a trailing portion, whereby the elongated support may be inserted in the tubular housing axially, with the leading end portion of the sleeve entering the housing before the trailing portion, and the sleeve may engage the inner surface of the housing to shock mount the support in the housing and to resist movement of the support in the housing in a direction opposite to the insertion direction.

In accordance with another broad aspect of the invention, a method of supporting a magnetic sensors in a tubular housing comprises providing a pair of spaced foam sleeves surrounding an elongated support on which magnetic sensors are mounted, attaching only the leading end portion of each sleeve to the support by wrapping adhesive tape about the leading end portion and the support, and inserting the assembly including the sensors, the support, and the sleeves axially into the housing so that the leading end portion of each sleeve enters the housing before the trailing portion of each sleeve and so that the sleeves engage the inner surface of the housing.

BRIEF DESCRIPTION OF THE DRAWINGS

The invention will be further described in conjunction with the accompanying drawings, which illustrate preferred and exemplary embodiments, and wherein.

DETAILED DESCRIPTION OF THE PREFERRED EMBODIMENTS

Figure 1:
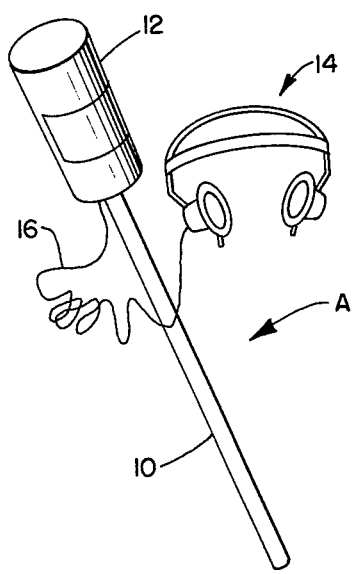
FIG. 1 is a perspective view of one type of magnetic detector apparatus in which the present invention may be employed.

Referring to the drawings, FIG. 1 illustrates the external appearance of a magnetic locator A of the type disclosed in the aforesaid patent, which is incorporated herein by reference. The present invention may be advantageously employed in magnetic detection apparatus of that type or in other magnetic detection apparatus having a tubular housing in which a magnetic sensor assembly is to be mounted. Housing 10 of locator A is a hollow nonmagnetic cylinder connected at one end to a can 12 of larger diameter that contains electronics employed in the locator. Earphones 14 are shown connected to can 12 by cable 16, although a loudspeaker may be employed in place of the earphones. In use, housing 10 may be grasped just below can 12 and swept back and forth along the ground to detect buried magnetic objects, producing an audible signal as set forth in the aforesaid patent.

Figure 2:
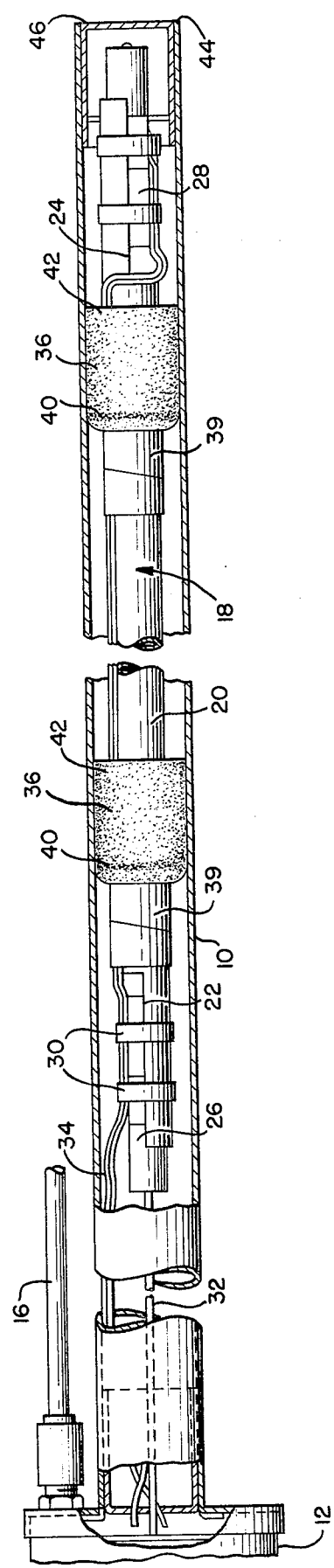
FIG. 2 is a contracted longitudinal sectional view illustrating a first form of the invention.

As shown in FIG. 2, within the housing 10 is a magnetic sensor assembly 18 comprising a nonmagnetic support tube 20 with a longitudinal notch or groove 22 or 24 at each end in which a corresponding magnetic sensor 26 or 28 is snap-fitted, all as described in the aforesaid patent. Retention of the magnetic sensors in the grooves may be assisted by adhesive tape 30 wrapped about the sensors and the ends of the tube 20. A stiff excitation wire 32 extends through the sensors and the tube 20. Wire 32 is preferably of hairpin configuration with its ends soldered to a circuit board in the can 12. As described in the patent, each magnetic sensor may comprise a nonmagnetic housing containing a tubular magnetic core through which the excitation wire extends, and each sensor may comprise a signal coil would in a circumferential groove of the sensor housing. The signal coils are connected by wires 34 to a balanced signal circuit in can 12. As described in the patent, an AC excitation current is applied to the excitation wire 32, but there will be no signal output from the balanced signal circuit until the locator is brought into proximity with a magnetic object.

Figure 4:
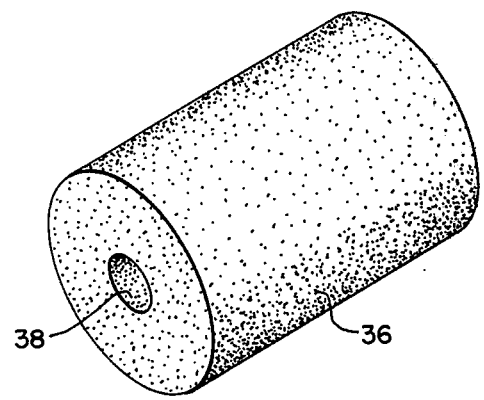
FIG 4 is a perspective view of a sleeve employed in the embodiment of FIG. 2.

Spaced sleeves 36 of resiliently compressible material are employed to support the sensor assembly 18 in the housing 10. As shown in FIG. 4, each sleeve comprises a foam cylinder with a central longitudinal bore 38. The wall thickness of the cylinder is preferably greater than the bore diameter. The sleeves may be formed of polyurethane foam, for example. Prior to insertion of sensor assembly 18 in housing 10, support tube 20 is inserted through the bores 38 of the sleeves in succession. Then the leading end of each sleeve (the end that enters housing 10 first) is attached to the support tube. As shown in FIG. 2, this is preferably accomplished by winding adhesive tape 39 about the leading end portion 40 of each sleeve and about the adjacent region of support tube 20. The adhesive tape compresses the leading end portion of each sleeve and imparts a slight taper to each sleeve, so that the leading end portion 40 of each sleeve is narrower than the trailing portion 42.

The sleeves are preferably mounted on and attached to the support tube 20 after the support tube has been assembled with the magnetic sensors 26 and 28, the excitation wire 32, etc. Then the entire magnetic sensor assembly, including the sleeves, is inserted axially through the open end 44 of housing 10. When the magnetic sensor assembly 18 has been inserted in the housing, the excitation wire 32 and lead wires 34 are connected to a circuit board at the left end of housing 10 in FIG. 2, after which can 12 is placed over the circuit board and attached to the housing 10. A cap 46 is inserted in the open end 44 of housing 10 to close the housing.

The sleeves 36 are of large enough diameter to engage the inner surface of housing 10 and to compress the sleeves somewhat as the assembly is inserted in the housing (from right to left in FIG. 2). Some force is required to insert the assembly 18 in the housing 10, but the taper of the sleeves facilitates insertion. Also, since the sleeves are attached to tube 20 only at their leading end portion, they are pulled into the housing by tube 20, and when the sleeves drag against the inner surface of the housing, they tend to contract transversely as they are pulled and expanded longitudinally. When the sleeves are at rest in the housing, they fit the housing snugly, providing excellent shock mounting of the magnetic sensor assembly 18 in housing 10.

Although the sensor assembly is readily inserted in the housing, any tendency of the sensor assembly to move in a direction opposite to the insertion direction is strongly resisted by virtue of the taper of the sleeves and by virtue of the attachment of the sleeves to the support tube 20 at their leading end portion only. Any force imparted to the sleeves by movement of the tube 20 in the direction to the right in FIG. 2 (as would occur during sweeping movement of locator A in FIG. 1) tends to compress the sleeves longitudinally and to expand them laterally. Thus the force required to move the sensor assembly in a direction opposite to the insertion direction is far greater than that required to insert the assembly in the housing.

The arrangement shown in FIG. 2 for mounting the magnetic sensor assembly 18 in tubular housing 10 provides excellent centering of the magnetic sensor assembly in the housing, which is desirable to avoid errors due to positioning of one of the magnetic sensors closer to the housing wall than the other. The embodiment of FIG. 3, which is disclosed in the aforesaid patent, has many of the advantages of the embodiment of FIG. 2 but does not provide as perfect centering. Since the embodiment of FIG. 3 differs from the embodiment of FIG. 2 only in the construction of the sleeves, the other parts will not be described.

Figure 5:
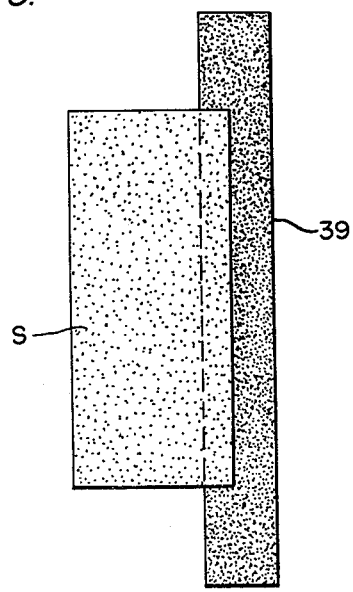
FIG. 5 is a plan view illustrating a foam strip and associated adhesive tape employed to form sleeves in the embodiment of FIG. 3.
Figure 3:
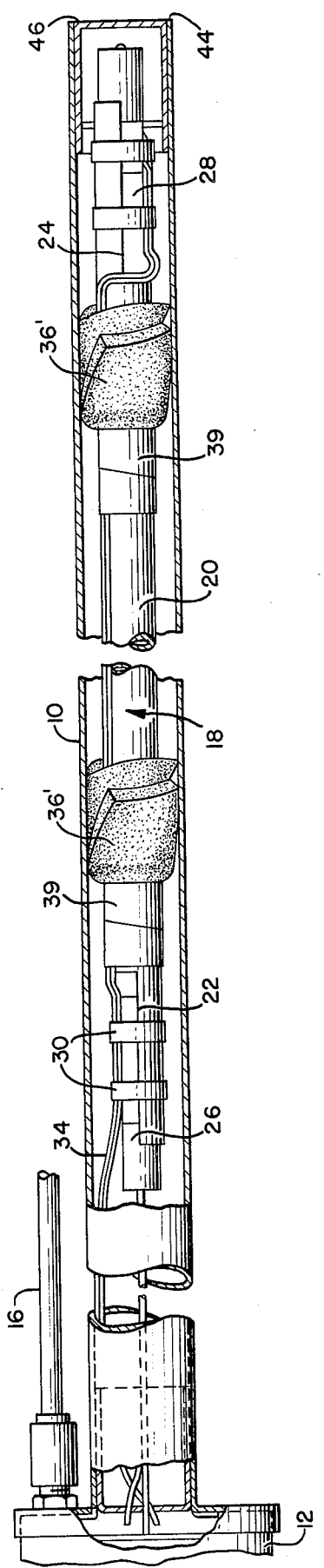
FIG. 3 is a similar view of another form of the invention.

As shown in FIG. 3, sleeves 36' are formed by wrapping a foam strip about the support tube 20, Initially, each strip is a flat rectangular piece of foam, designated by reference character S in FIG. 5. The strip is then wrapped helically about the support tube 20 and held in that configuration by the adhesive tape 39, which is similarly (and, if desired, concurrently) wrapped so as to overlap both the foam strip and the support tube. This technique provides sleeves that are tapered, i.e., wider at the trailing end than at the leading end, and that are firmly secured to the support tube 20 at the leading end only. The magnetic sensor assembly 18 with the sleeves 36' attached thereto is readily inserted in the housing 10 in the manner described with respect to FIG. 2, and provides shock mounting and resistance to movement of the sensor assembly in a direction opposite to the insertion direction. However, the centering of the magnetic sensor assembly is not as good as in the embodiment of FIG. 2, and the thickness of the foam tends to be more critical as to production tolerances. The foam sleeves 36 can be stamped out from tubing with a punch and die set, and the thickness of the foam is not critical.

While several embodiments of the invention have been shown and described, it will be apparent to those skilled in the art that changes can be made in these embodiments without departing from the principles and spirit of the invention, the scope of which is defined in the appended claims.

The invention claimed is:

1. Apparatus for supporting magnetic sensors in a tubular housing, comprising an elongated support adapted to have magnetic sensors mounted thereon, a resiliently compressible sleeve through which said support extends, and attachment means securing the sleeve to the support at a leading end portion of the sleeve, the sleeve being tapered so that it is narrower at the leading end portion than at a trailing portion, whereby the elongated support may be inserted in the tubular housing axially, with the leading end portion of the sleeve entering the housing before the trailing portion, and the sleeve may engage the inner surface of the housing to shock mount the support in the housing and to resist movement of the support in the housing in a direction opposite to the insertion direction.

2. Apparatus in accordance with claim 1, wherein the sleeve is attached to the support by means compressing the sleeve at the leading end portion.

3. Apparatus in accordance with claim 2, wherein the attachment means comprises an adhesive tape wrapped about the leading end portion of the sleeve and about the support.

4. Apparatus in accordance with claim 3, wherein the sleeve is a continuous foam cylinder.

5. Apparatus in accordance with claim 3, wherein the sleeve is a wound foam strip.

6. Magnetic detector apparatus comprising a non-magnetic tubular housing, an elongated magnetic sensor support in said housing extending axially of the housing, and a pair of spaced sleeves surrounding the sensor support and spacing the sensor support from the inner surface of the housing, each sleeve being formed of resiliently compressible material and having its leading end portion secured to the support by attachment means so that the sleeve may be pulled into the housing from its leading end portion.

7. Apparatus in accordance with claim 6, wherein the leading end portion of each sleeve is secured to the support by attachment means wrapped about the leading end portion and the support so as to compress the leading end portion of the sleeve.

8. Apparatus in accordance with claim 7, wherein each sleeve is a continuous foam cylinder.

9. Apparatus in accordance with claim 7, wherein each sleeve comprises a foam strip wound upon the support.

10. A method of supporting a magnetic sensor assembly in a tubular housing, which comprises providing a pair of spaced foam sleeves surrounding an elongated support on which magnetic sensors are mounted, attaching only the leading end portion of each sleeve to the support by wrapping adhesive tape about the leading end portion and the support, and inserting the assembly including the sensors, the support and the sleeves axially into the housing so that the leading end portion of each sleeve enters the housing before a trailing portion of each sleeve and so that the sleeves engage the inner surface of the housing.

11. A method in accordance with claim 10, wherein each sleeve is a continuous foam cylinder with a central bore into which the support is inserted.

12. A method in accordance with claim 10, wherein each sleeve is formed by wrapping a strip of foam material about the support.

* * * * *